United States Patent
Burbank et al.

(10) Patent No.: US 12,535,745 B2
(45) Date of Patent: Jan. 27, 2026

(54) LITHOGRAPHIC APPARATUS, LOCKING DEVICE, AND METHOD

(71) Applicant: ASML Holding N.V., Veldhoven (NL)

(72) Inventors: Daniel Nathan Burbank, Ridgefield, CT (US); Andi Dine, Stamford, CT (US)

(73) Assignee: ASML Holding N.V., Veldhoven (NL)

( * ) Notice: Subject to any disclaimer, the term of this patent is extended or adjusted under 35 U.S.C. 154(b) by 111 days.

(21) Appl. No.: 18/578,151

(22) PCT Filed: Jun. 28, 2022

(86) PCT No.: PCT/EP2022/067794
§ 371 (c)(1),
(2) Date: Jan. 10, 2024

(87) PCT Pub. No.: WO2023/285140
PCT Pub. Date: Jan. 19, 2023

(65) Prior Publication Data
US 2024/0319618 A1    Sep. 26, 2024

Related U.S. Application Data

(60) Provisional application No. 63/221,695, filed on Jul. 14, 2021.

(51) Int. Cl.
*G03F 7/00* (2006.01)
(52) U.S. Cl.
CPC ...... *G03F 7/70716* (2013.01); *G03F 7/70825* (2013.01)
(58) Field of Classification Search
CPC ............ G03F 7/70691; G03F 7/70716; G03F 7/70725; G03F 7/70825
See application file for complete search history.

(56) References Cited

U.S. PATENT DOCUMENTS

| 5,018,901 A | 5/1991 | Ferree et al. |
| 6,264,773 B1 * | 7/2001 | Cerio .................. G03F 7/70983 430/5 |

(Continued)

FOREIGN PATENT DOCUMENTS

| CN | 100470752 C | 3/2009 |
| JP | 2003-258063 A | 9/2003 |

(Continued)

OTHER PUBLICATIONS

International Search Report and Written Opinion of the International Searching Authority directed to International Patent Application No. PCT/EP2022/067794, mailed Nov. 8, 2022; 13 pages.

(Continued)

*Primary Examiner* — Deoram Persaud
(74) *Attorney, Agent, or Firm* — Sterne, Kessler, Goldstein & Fox P.L.L.C.

(57) ABSTRACT

A lithographic apparatus includes an illumination system to illuminate a pattern of a patterning device, a projection system to project an image of the pattern onto a substrate, a movable stage to support the patterning device or the substrate, a slotted object, and a locking device (700) to prevent a motion of the movable stage. The locking device comprises an actuator (702) and a wheel device (704) comprising a ring feature (708) and coupled to the actuator. The actuator rotates the wheel device about a rotation axis (706). The ring feature has a width (710) defined parallel to the rotation axis. The width is variable with respect to azimuthal direction of the wheel device. The ring feature engages a slot of the slotted object. The rotating adjusts the width of the ring feature within the slot such that a relative motion between the device and the slotted object is prevented.

15 Claims, 10 Drawing Sheets

(56) References Cited

U.S. PATENT DOCUMENTS 6,911,283 B1 * 6/2005 Gordon .................. G03B 27/62
355/75
2020/0179008 A1 * 6/2020 Biedermann ...... A61B 17/7001

FOREIGN PATENT DOCUMENTS

| JP | 2007-201095 A | 8/2007 |
| KR | 102167687 B1 | 10/2020 |
| WO | WO 2020/126813 A2 | 6/2020 |

OTHER PUBLICATIONS

International Preliminary Report on Patentability directed to International Patent Application No. PCT/EP2022/067794, issued Jan. 16, 2024; 9 pages.
"Defect Free Reticle Clamping," Disclosed Anonymously, Research Disclosure No. 640004, Jun. 26, 2017; 4 pages.

* cited by examiner ately indicate identical, functionally similar, and/or structurally similar elements. Additionally, generally, the left-most digit(s) of a reference number identifies the drawing in

LITHOGRAPHIC APPARATUS, LOCKING DEVICE, AND METHOD

CROSS-REFERENCE TO RELATED APPLICATIONS

This application claims priority of U.S. Provisional Patent Application No. 63/221,695, which was filed on Jul. 14, 2021, and which is incorporated herein in its entirety by reference.

FIELD

The present disclosure relates to locking mechanisms for moveable support stages, for example, substrate stages for supporting reticles and/or wafers in lithography apparatuses and systems.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

During a reticle exchange process, a reticle handoff from a reticle handler to a clamp of a reticle stage includes an unknown reticle position offset and reticle tilt offset. Tilt or excessive non-alignment between the clamp and reticle can be a source of particle generation and can damage the reticle or clamp over time. Despite calibration, variations still exist due to reticle mechanical and positioning tolerances, which can lead to high corner impacts and unpredictable first contact points on the clamp and reticle.

SUMMARY

Accordingly, there is a need to reduce damage to the reticle and clamp in a reliable, uniform, and efficient manner.

In some embodiments, a lithographic apparatus comprises an illumination system, a projection system, a movable stage, a slotted object, and a locking device. The illumination system is configured to illuminate a pattern of a patterning device. The projections system is configured to project an image of the pattern on to a substrate. The movable stage is configured to support the patterning device or the substrate. The locking device is configured to prevent a motion of the movable stage. The locking devices comprises an actuator and a wheel device comprising a ring feature and coupled to the actuator. The actuator is configured to rotate the wheel device about a rotation axis. The ring feature has a width defined parallel to the rotation axis. The width is variable with respect to an azimuthal direction of the wheel device. The ring feature is configured to engage a slot of the slotted object. The wheel device or the slotted object is coupled to the movable stage. The rotating adjusts the width of the ring feature within the slot such that a relative motion between the device and the slotted object is prevented.

In some embodiments, a device comprises and actuator and a wheel device comprising a ring feature and coupled to the actuator. The actuator is configured to rotate the wheel device about a rotation axis. The ring feature has a width defined parallel to the rotation axis. The width is variable with respect to an azimuthal direction of the wheel device. The ring feature is configured to engage a slot of an object. The rotating adjusts the width of the ring feature within the slot such that a relative motion between the device and the object is prevented.

In some embodiments, a method is directed to using a locking device comprising a slotted object and an actuator coupled to a wheel device comprising a ring feature having a width that is variable with respect to an azimuthal direction of the wheel device. The method comprises rotating the wheel device about a rotation axis using the actuator. The method further comprises engaging, via the rotating, a slot of the slotted object using the ring feature. The method further comprises adjusting, via the rotating, the width of the ring feature within the slot such that a relative motion between the locking device and the slotted object is prevented.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 6A:
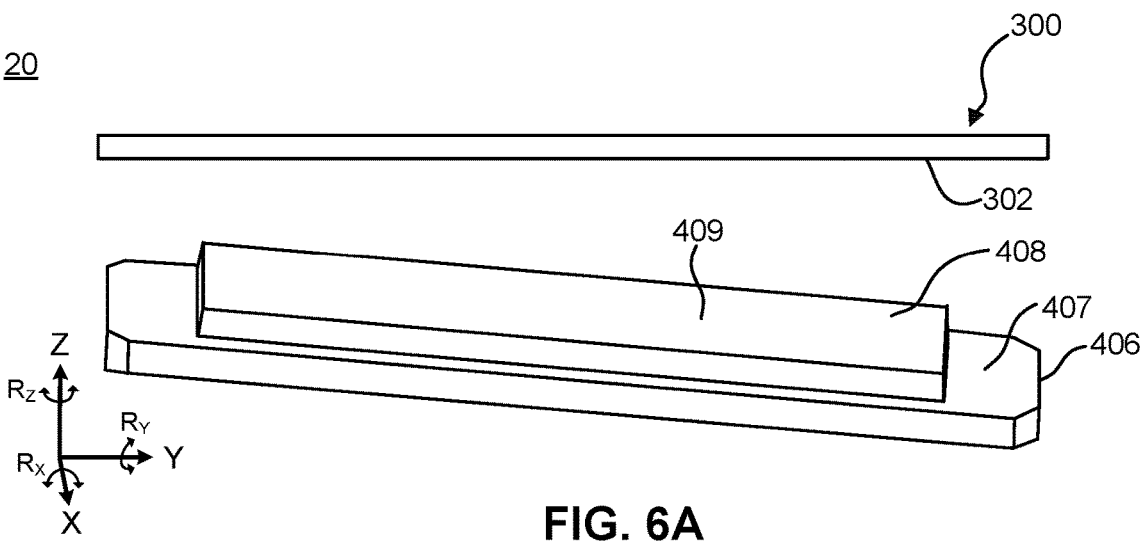
Figure 6B:
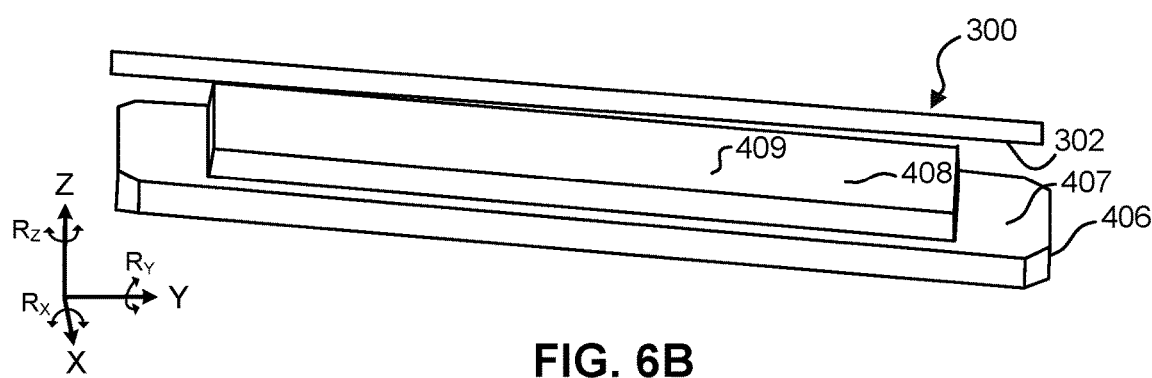
Figure 6C:
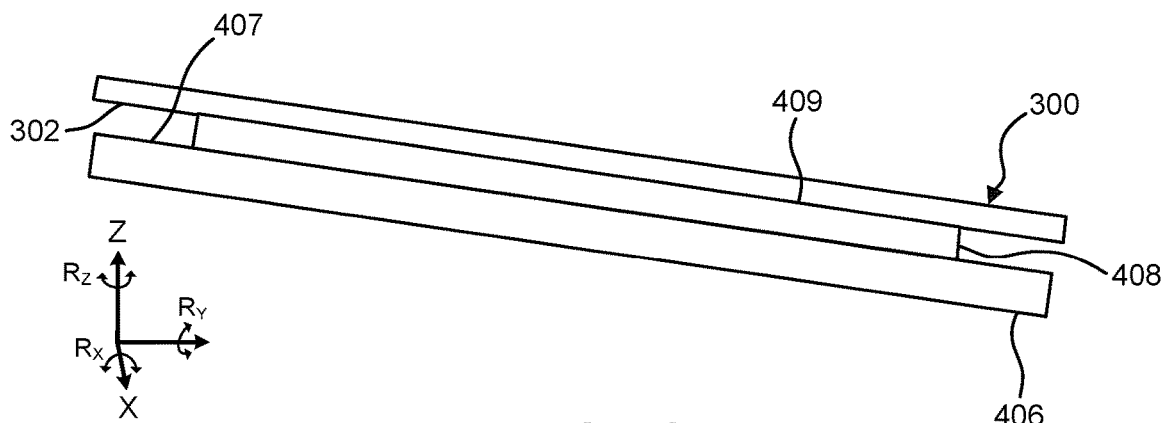

FIGS. 6A, 6B, and 6C show a reticle exchange apparatus in different configurations, according to some embodiments.

FIGS. 7, 8A-B, and 9 show a locking device, according to some embodiments.

Figure 10A:
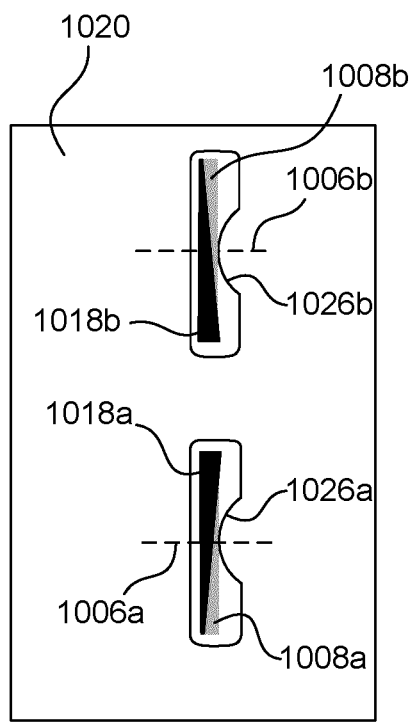
Figure 10B:
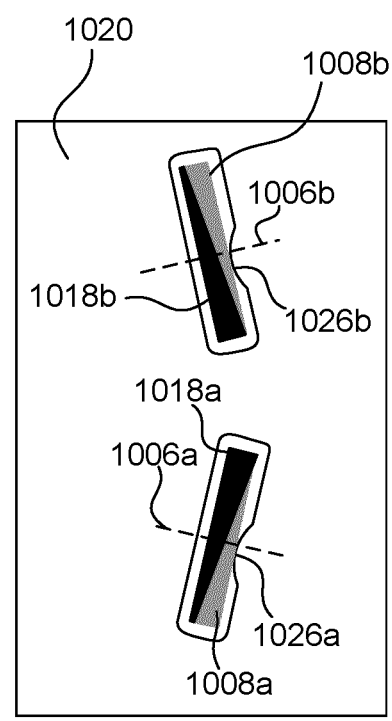

FIGS. 10A and 10B show a slotted object used in connection with a locking device, according to some embodiments.

Figure 11:
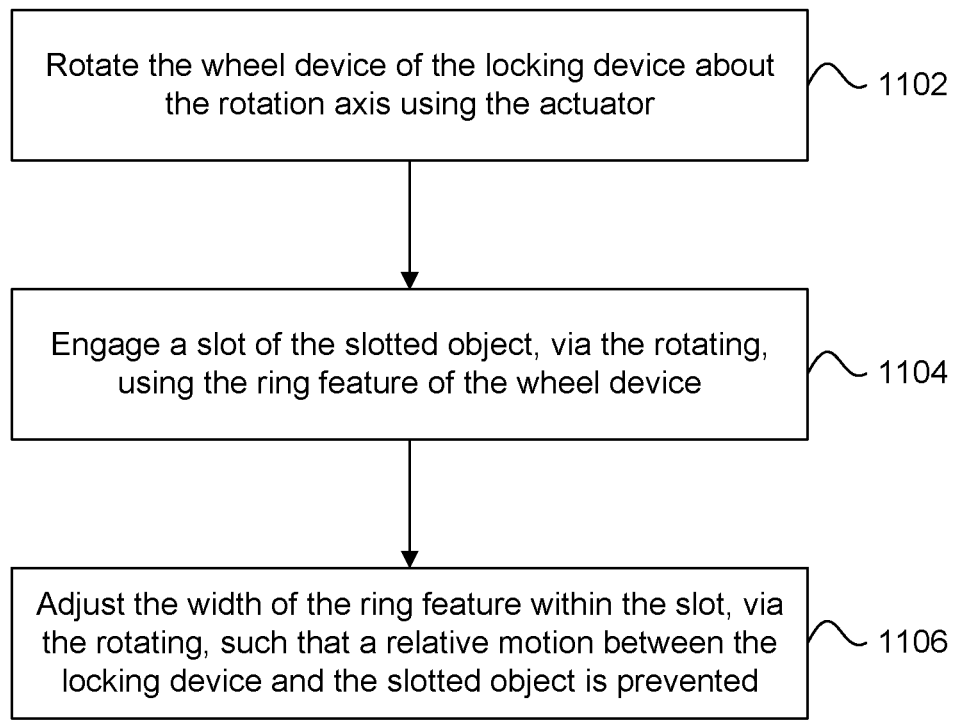

FIG. 11 shows a flowchart of method steps, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" may be used herein indicates the value of a given quantity that can vary based on a particular technology. Based on the particular technology, the term "about" may indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc., and in doing that may cause actuators or other devices to interact with the physical world.

Before describing such embodiments in more detail, however, it is instructive to present an example environment in which embodiments of the present disclosure may be implemented.

Exemplary Lithographic System

Figure 1:
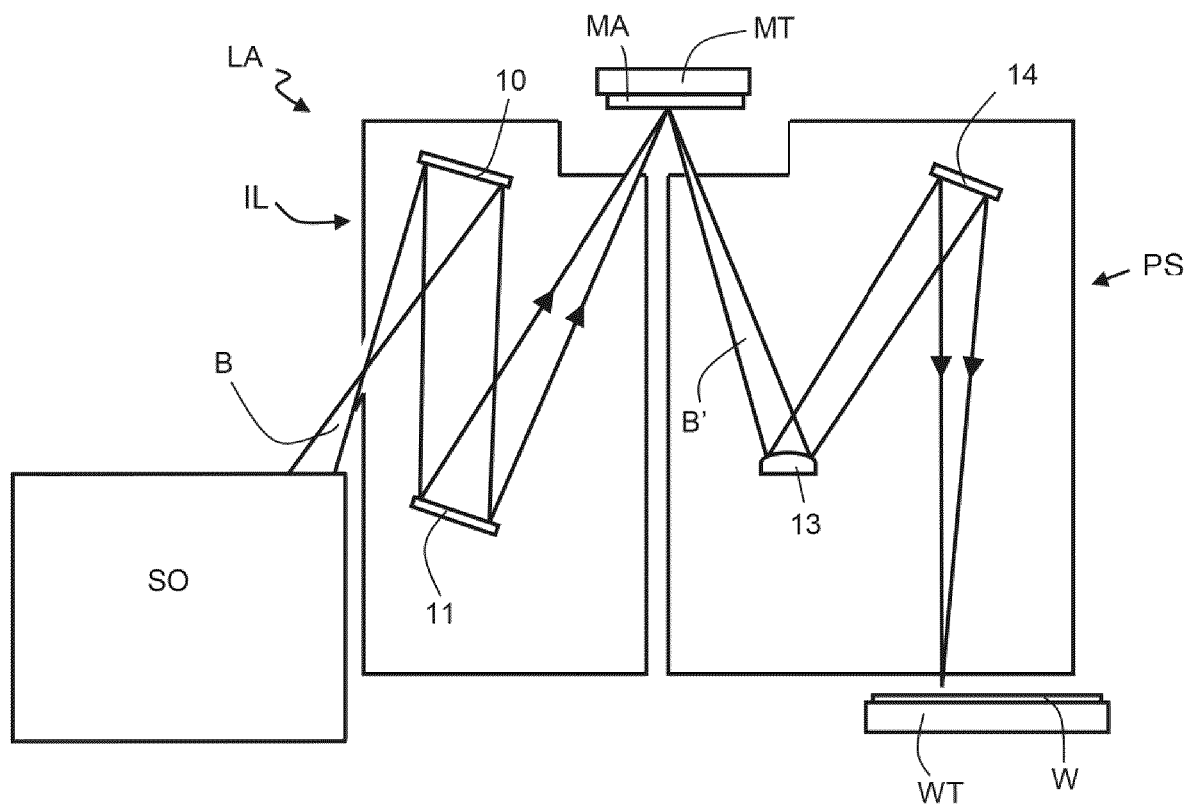
FIG. 1 shows a lithographic apparatus, according to some embodiments.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS, and a substrate table WT configured to support a substrate W.

The illumination system IL is configured to condition the EUV radiation beam B before the EUV radiation beam B is incident upon the patterning device MA. Thereto, the illumination system IL can include a faceted field mirror device 10 and a faceted pupil mirror device 11. The faceted field mirror device 10 and faceted pupil mirror device 11 together provide the EUV radiation beam B with a desired cross-sectional shape and a desired intensity distribution. The illumination system IL can include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS can comprise a plurality of mirrors 13, 14 that are configured to project the patterned EUV radiation beam B' onto the substrate W held by the substrate table WT. The projection system PS can apply a reduction factor to the patterned EUV radiation beam B', thus forming an image with features that are smaller than corresponding features on the patterning device MA. For example, a reduction factor of 4 or 8 can be applied. Although the projection system PS is illustrated as having only two mirrors 13, 14 in FIG. 1, the projection system PS can include a different number of mirrors (e.g. six or eight mirrors).

The substrate W can include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, can be provided in the radiation source SO, in the illumination system IL, and/or in the projection system PS.

The radiation source SO can be a laser produced plasma (LPP) source, a discharge produced plasma (DPP) source, a free electron laser (FEL), or any other radiation source that is capable of generating EUV radiation.

Exemplary Reticle Stage

Figure 2:
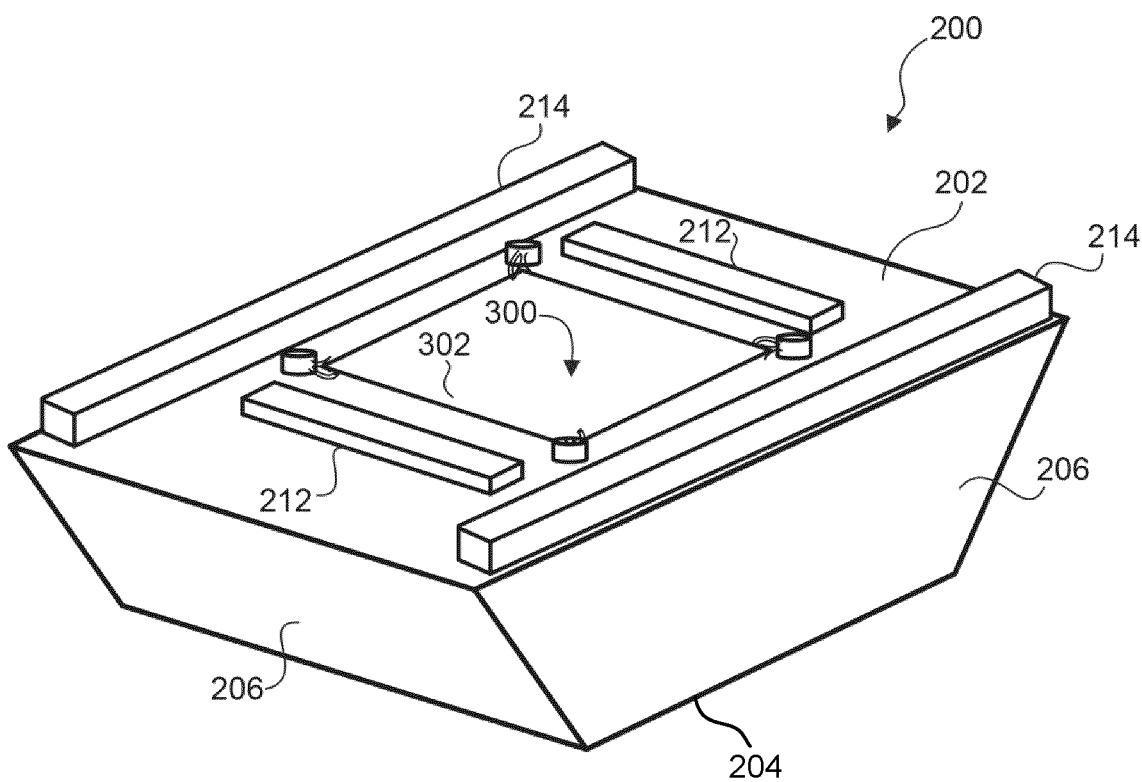
FIGS. 2 and 3 show a reticle stage, according to some embodiments.
Figure 3:
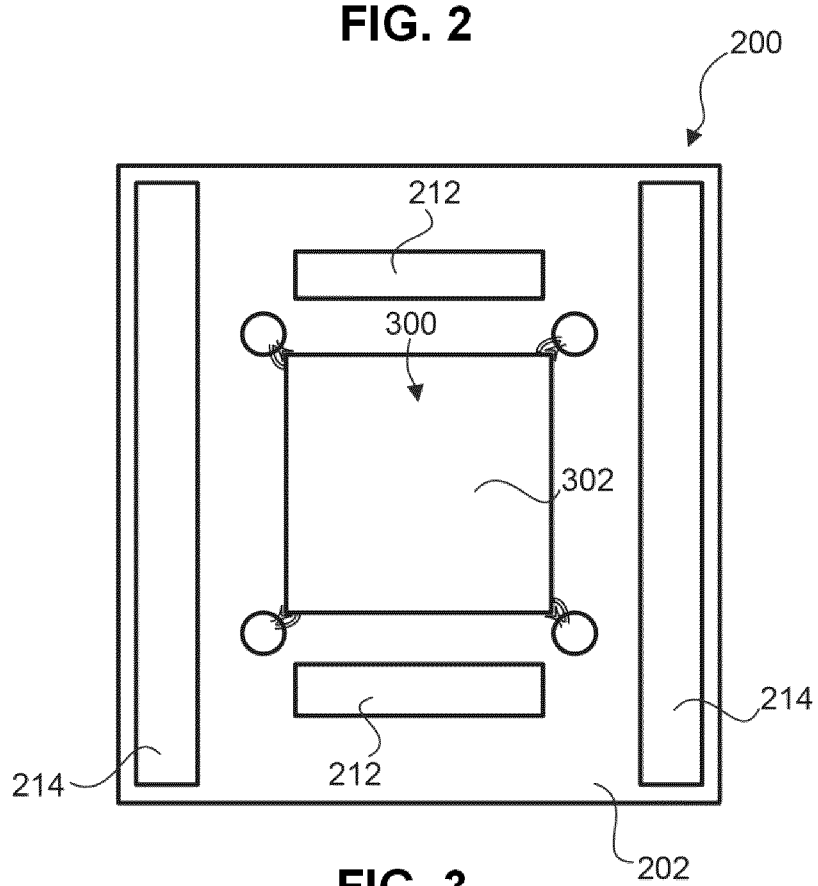

FIGS. 2 and 3 show an exemplary reticle stage 200, according to some embodiments. Reticle stage 200 can include top stage surface 202, bottom stage surface 204, side stage surfaces 206, and clamp 300. In some embodiments, reticle stage 200 with clamp 300 can be implemented in lithographic apparatus LA. For example, reticle stage 200 can be support structure MT in lithographic apparatus LA. In some embodiments, clamp 300 can be disposed on top stage surface 202. For example, as shown in FIG. 2, clamp 300 can be disposed at a center of top stage surface 202 with clamp frontside 302 facing perpendicularly away from top stage surface 202.

In some lithographic apparatuses, for example, lithographic apparatus LA, a reticle stage 200 with a clamp 300 can be used to hold and position a reticle 408 (FIG. 4) for scanning or patterning operations. In one example, the reticle stage 200 can require powerful drives, large balance masses, and heavy frames to support it. In one example, the reticle stage 200 can have a large inertia and can weigh over 100 kg to propel and position a reticle 408 weighing about 0.5 kg. To accomplish reciprocating motions of the reticle 408, which are typically found in lithographic scanning or patterning operations, accelerating and decelerating forces can be provided by linear motors that drive the reticle stage 200.

In some embodiments, as shown in FIGS. 2 and 3, reticle stage 200 can include first encoder 212 and second encoder 214 for positioning operations. For example, first and second encoders 212 and 214 can be used by interferometers. First encoder 212 can be a fiducial and second encoder 214 can be have positioning encoder scales. Fiducials can define a specific location while positioning encoder scales can be measured by encoders to determine positioning relative to the defined location. First encoder 212 can be attached along a first direction, for example, a transverse direction (i.e., X-direction) of reticle stage 200. And second encoder 214 can be attached along a second direction, for example, a longitudinal direction (i.e., Y-direction) of reticle stage 200. In some embodiments, as shown in FIGS. 2 and 3, first encoder 212 can be orthogonal to second encoder 214.

As shown in FIGS. 2 and 3, reticle stage 200 can include clamp 300. Clamp 300 is configured to hold reticle 408 in a fixed plane on reticle stage 200. Clamp 300 includes clamp frontside 302 and can be disposed on top stage surface 202. In some embodiments, clamp 300 can use mechanical, vacuum, electrostatic, or other suitable clamping techniques to hold and secure an object. In some embodiments, clamp 300 can be an electrostatic clamp, which can be configured to electrostatically clamp (i.e., hold) an object, for example, reticle 408 in a vacuum environment. Due to the requirement to perform EUV in a vacuum environment, vacuum clamps cannot be used to clamp a mask or reticle and instead electrostatic clamps can be used. For example, clamp 300 can include an electrode, a resistive layer on the electrode, a dielectric layer on the resistive layer, and burls projecting from the dielectric layer. In use, a voltage can be applied to clamp 300, for example, several kV. And current can flow through the resistive layer, such that the voltage at an upper surface of the resistive layer will substantially be the same as the voltage of the electrode and generate an electric field. Also, a Coulomb force, attractive force between electrically opposite charged particles, will attract an object to clamp 300 and hold the object in place. In some embodiments, clamp 300 can be a rigid material, for example, a metal, a dielectric, a ceramic, or a combination thereof.

Exemplary Reticle Exchange Apparatus

FIGS. 4, 5, 6A, 6B, and 6C show an exemplary reticle exchange apparatus 100, according to some embodiments. Reticle exchange apparatus 100 can be configured to minimize reticle exchange time, particle generation, and contact forces or stresses from clamp 300 and/or reticle 408 to reduce damage to clamp 300 and reticle 408 and increase overall throughput in a reticle exchange process, for example, in a lithographic apparatus LA.

Figure 4:
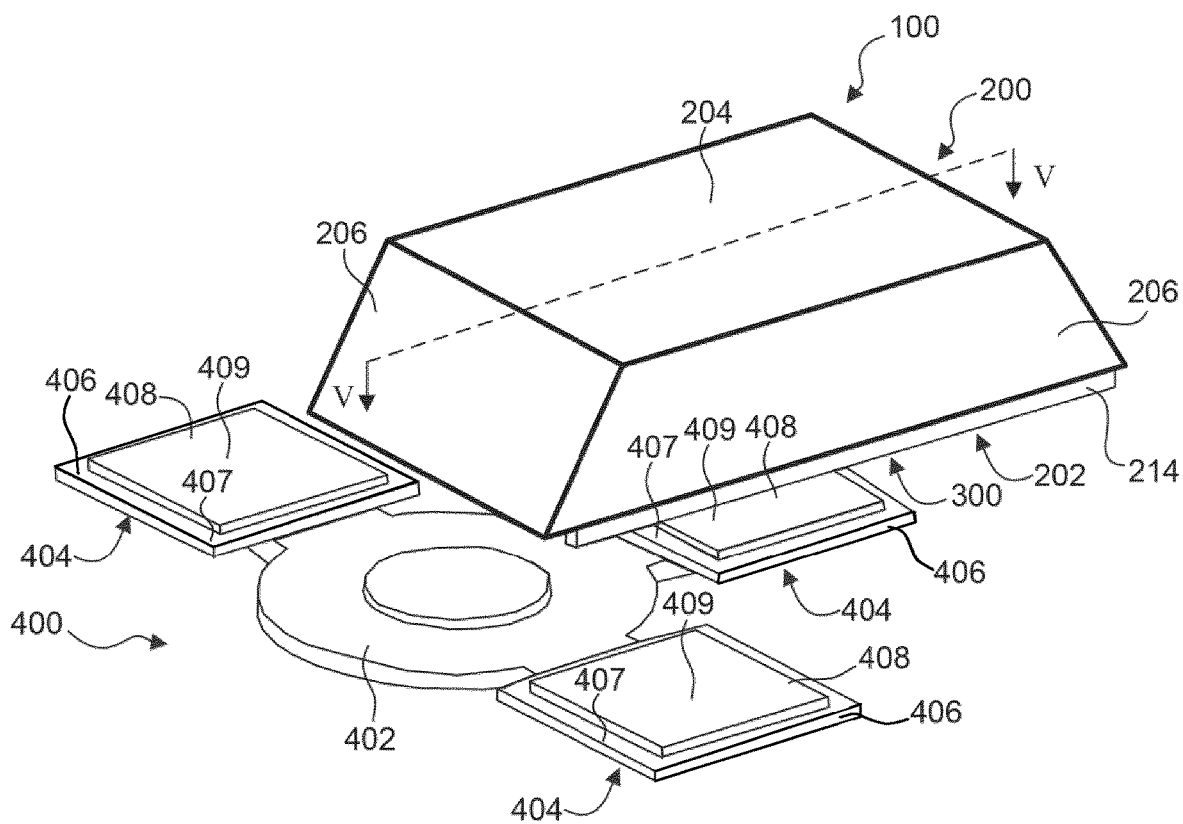
FIGS. 4 and 5 show a reticle exchange apparatus, according to some embodiments.
Figure 5:
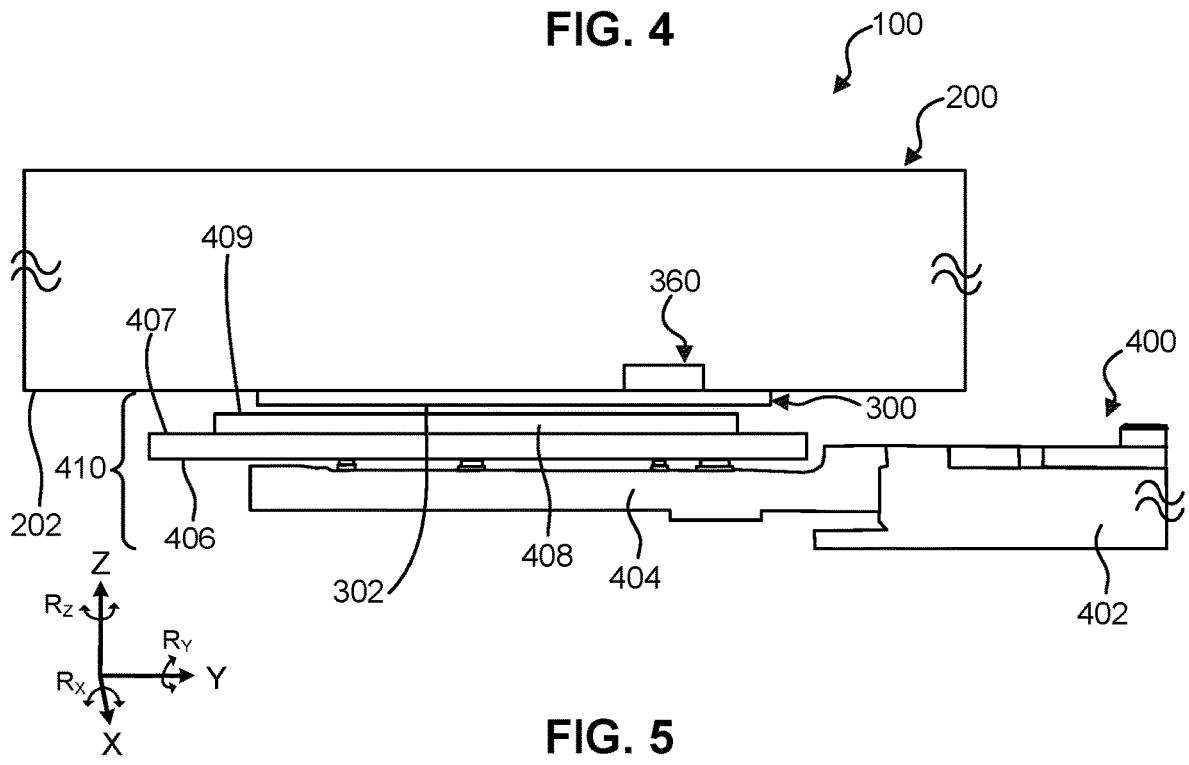

As shown in FIGS. 4 and 5, reticle exchange apparatus 100 can include reticle stage 200, clamp 300, and in-vacuum robot 400. In-vacuum robot 400 can include reticle handler 402.

In some embodiments, reticle handler 402 can be a rapid exchange device (RED), which is configured to efficiently rotate and minimize reticle exchange time. For example, reticle handler 402 can save time by moving multiple reticles from one position to another substantially simultaneously, instead of serially.

In some embodiments, as shown in FIG. 4, reticle handler 402 can include one or more reticle handler arms 404. Reticle handler arm 404 can include reticle baseplate 406. Reticle baseplate 406 can be configured to hold an object, for example, reticle 408.

In some embodiments, reticle baseplate 406 can be an extreme ultraviolet inner pod (EIP) for a reticle. In some embodiment, reticle baseplate 406 includes reticle baseplate frontside 407, and reticle 408 includes reticle backside 409.

In some embodiments, as shown in FIGS. 4 and 5, reticle baseplate 406 can hold reticle 408 such that reticle baseplate frontside 407 and reticle backside 409 each face top stage surface 202 and clamp frontside 302. For example, reticle baseplate frontside 407 and reticle backside 409 can be facing parallel to top stage surface 202 and clamp frontside 302.

As shown in FIG. 5, reticle exchange apparatus 100 can include reticle exchange area 410, which is the cross-sectional area between clamp 300, reticle 408, reticle baseplate 406, and reticle handler arm 404 during a reticle exchange process.

In some embodiments, as shown in FIG. 4, reticle handler arms 404 can be arranged symmetrically about reticle handler 402. For example, reticle handler arms 404 can be spaced from each other by about 90 degrees, 120 degrees, or 180 degrees. In some embodiments, reticle handler arms 404 can be arranged asymmetrically about reticle handler 402. For example, two reticle handler arms 404 can be spaced from each other by about 135 degrees, while another two reticle handler arms 404 can be spaced from each other by about 90 degrees.

In one example, during a reticle exchange process, reticle handler arm 404 of reticle handler 402 positions reticle 408 on reticle baseplate 406 towards clamp 300 in reticle exchange area 410. As described above, a reticle handoff from reticle handler 402 to clamp 300 includes an unknown reticle position offset, which includes a reticle vertical distance offset (i.e., Z-direction offset) and a reticle tilt offset (i.e., $R_X$ offset and $R_Y$ offset). Tilt or excessive non-alignment between clamp 300 and reticle 408 can be a source of particle generation and can damage reticle 408 or clamp 300 over time. Reticle backside 409 and clamp frontside 302 should be in coplanar alignment for a final handoff. Despite calibration, variations still exist due to reticle mechanical and positioning tolerances, which can lead to high corner impacts and unpredictable first contact points between clamp 300 and reticle 408.

In one example, the reticle exchange process can involve lowering reticle stage 200 with clamp 300, which starts far away from reticle handler 402, as close to reticle 408 as possible until clamp 300 contacts reticle 408 to account for all possible offsets and/or tilts. During a reticle exchange process, reticle stage 200 with clamp 300 can be adjusted in a multi-stage movement.

As shown in FIGS. 6A through 6C, a reticle exchange apparatus (e.g., such as reticle exchange 100 (FIGS. 4 and 5)) can include clamp 300, reticle 408, and reticle baseplate 406. The multi-stage movement can occur in four stages: (1) approach; (2) first contact; (3) full contact; and (4) voltage applied to clamp.

First, as shown in FIG. 6A, reticle exchange apparatus 100 can be in an approach configuration 20 and clamp 300 can be adjusted in a substantially vertical direction (i.e., Z-direction) toward reticle backside 409. In approach configuration 20, clamp 300 is turned off (i.e., no applied voltage) and reticle handler 402 deactivates the vertical direction (i.e., Z-direction) and tilt (i.e., $R_X$ and $R_Y$, rotation about X-direction and rotation about Y-direction, respectively) servo motors of reticle handler arm 404 in reticle exchange area 410. The motors (i.e., Z, $R_X$, and $R_Y$) brake and rotation about Z-direction (i.e., $R_Z$) activates.

Second, as shown in FIG. 6B, reticle exchange apparatus 100 can be in a first contact configuration 30 and clamp 300 can be adjusted in a substantially vertical direction (i.e., Z-direction) toward reticle backside 409 until clamp 300 makes contact with reticle backside 409. In first contact configuration 30, clamp 300 is turned off and clamp 300 makes contact with reticle backside 409, for example, a corner of reticle 408, and then rotates or tilts about the contact point between the clamp 300 and the reticle backside 409 (i.e., $R_X$ and $R_Y$).

Third, as shown in FIG. 6C, reticle exchange apparatus 100 can be in a full contact configuration 40 and clamp 300 can be rotationally adjusted about the contact point between the clamp 300 and the reticle backside 409 (i.e., $R_X$ and $R_Y$) toward reticle backside 409 until clamp 300 makes full contact with reticle backside 409. In full contact configuration 40, clamp 300 is turned off and clamp 300 makes full contact with reticle backside 409. For example, all four corners of reticle 408 contact the clamp 300 and the clamp 300 is coplanar with reticle backside 409.

In some embodiments, in full contact configuration 40, clamp 300 makes contact with all four corners of reticle 408 and continues to move in a substantially vertical direction (i.e., Z-direction) until a mechanical force of at least 5 N is achieved.

Fourth, with clamp frontside 302 and reticle backside 409 aligned and coplanar, clamp 300 is turned on (i.e., a voltage is applied to clamp 300) and reticle 408 is held in a fixed plane on clamp 300.

In some embodiments, as shown in FIG. 5, reticle exchange apparatus 100 can include clamp controller 360. Clamp controller 360 can be coupled to clamp 300 and be configured to control a position of clamp 300. For example, clamp controller 360 can be configured to control reticle stage 200 to allow compliant movement of clamp 300. In some embodiments, clamp controller 360 can be coupled to servo motors or servo actuators (i.e., X-direction, Y-direction, Z-direction, $R_X$, $R_Y$, $R_Z$) of reticle stage 200 and/or clamp 300. For example, clamp controller 360 can control translations of reticle stage 200 with clamp 300 along an x-axis, y-axis, and z-axis (i.e., X-direction, Y-direction, Z-direction) and rotations about the x-axis, y-axis, and z-axis (i.e., $R_X$, $R_Y$, $R_Z$), where the x-axis, y-axis, and z-axis are orthogonal coordinates.

Exemplary Mechanical Locking Devices

Movable structures can present challenges from a risk management perspective. For example, lithographic apparatuses rely on high precision structural elements to fabricate ICs with sub-nanometer accuracy. A patterning device (e.g., a reticle) is one example of a high precision structural element. Lithographic apparatuses can perform multiple reticle exchanges for transferring multiple pattern layers onto a substrate (e.g., reticle exchange as described in reference to FIGS. 4, 5, 6A, 6B, and 6C). A reticle can be at its most vulnerable when a reticle stage picks up the reticle from its resting plate. FIG. 6C, according to some embodiments, shows a reticle 408 resting in contact with reticle baseplate 406 while in contact with clamp 300 (clamp 300 is part of reticle stage 200). Any force on reticle 408 along the X or Y directions can induce a shear force on reticle 408, which can damage sensitive patterns on reticle 408 or fracture reticle 408.

While conventional lithographic apparatuses use conventional locking devices to prevent relative motion of reticle baseplate 406 and reticle stage 200 (e.g., breaks, interlocks, or the like), the conventional locking devices may not be effective in exceptional circumstances, such as power loss, earthquake, or the like. A damaged reticle can cause a lithographic apparatus to become inoperable until maintenance and/or replacement of the reticle is performed. The downtime can lead to lost production and revenue. Therefore, in some embodiments, it is desirable to have improved locks that prohibit and/or reduce movement of reticle baseplate 406 and reticle stage 200 relative to one another during the handoff of reticle 408. The above example involving a reticle in a lithographic apparatus should be understood to be non-limiting. It should be appreciated that devices with moving parts in general can use embodiments of locking devices disclosed herein for stopping relative motion between two structures.

In some embodiments, movable parts such as reticle stage 200 and reticle exchange apparatus 100 (FIG. 2) can be designed such that some clearance is built into the design. The amount of clearance can be based on positional accuracy and reproducibility (e.g., a reticle stage 200 may not always be able to reproduce a position), as well as operational ranges and manufacturing tolerances. For example, consider a conventional immobilizer lock for preventing a relative movement between reticle stage 200 and reticle exchange apparatus 100 (FIG. 2). The conventional immobilizer lock can comprise a cylindrical slot and cylindrical piston. To engage the lock, the piston is driven into the slot. If the sizes of the slot and piston are an exact match (zero clearance), a small uncertainty in the position of the piston can cause the piston to fail in engaging the slot, rendering the immobilizer lock ineffective. Therefore, conventional immobilizer locks include some clearance margin to prevent locking failure (e.g., slot is designed slightly wider than pin). However, the introduction of clearance in a lock design can conflict with the issues described above regarding power loss, earthquakes, or the like. In the event of a power loss (non-limiting example), the designed clearance creates an opportunity for two structures to move within the clearance window.

The movement can damage sensitive structures, for example, inducing a shear force on a reticle as described above. Embodiments described herein can be used to address issues of conventional immobilizer locks. Embodiments described herein can be used to prevent relative motion between two structures, lock one or more degrees of freedom, allow larger manufacturing tolerances, and/or prevent undue wear and contamination.

Figure 7:
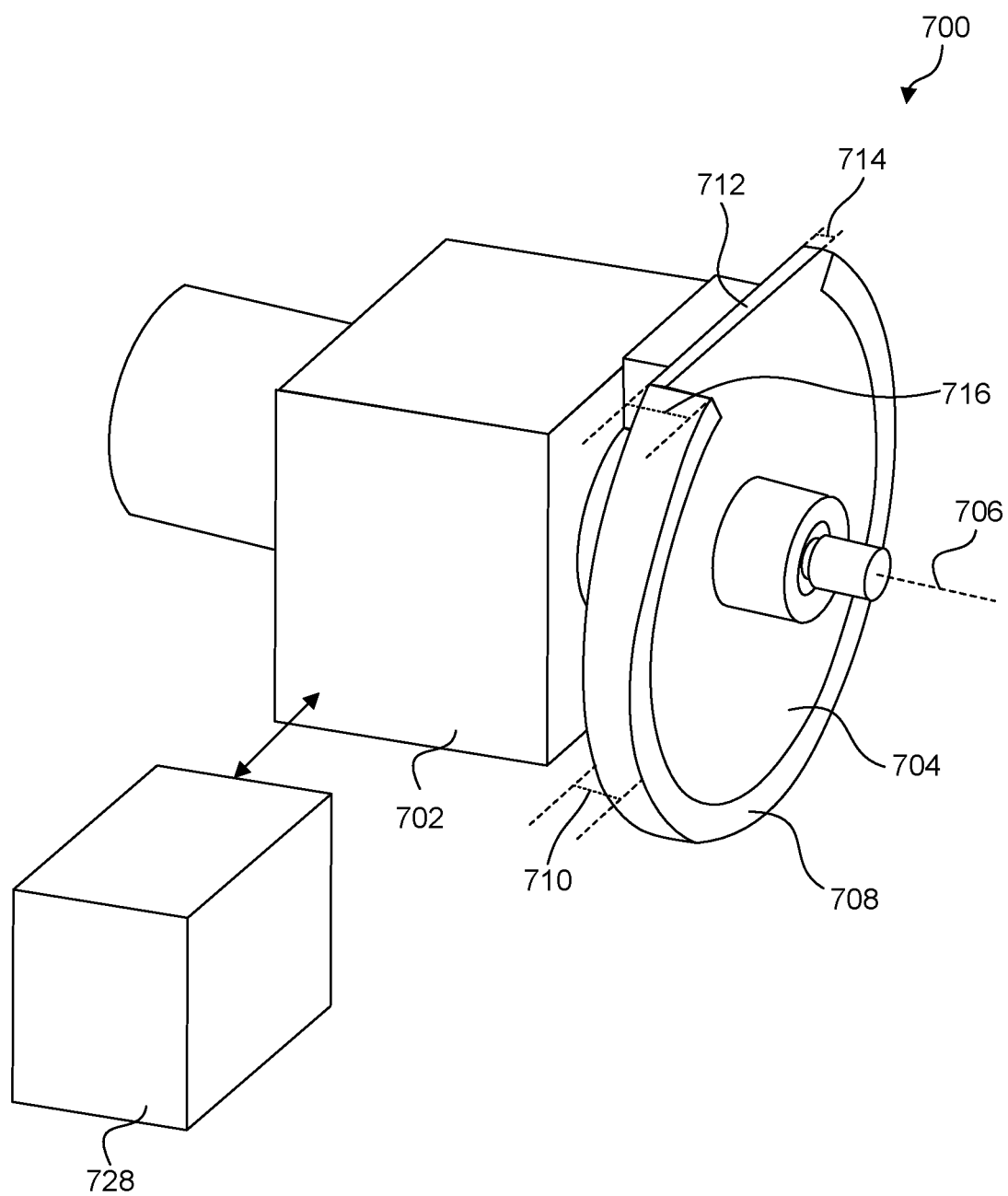

FIG. 7 shows a locking device 700, according to some embodiments. In some embodiments, locking device 700 can comprise an actuator 702, a wheel device 704, and a rotation axis 706. Wheel device 704 can comprise a ring feature 708. Ring feature 706 can have a width 710 (e.g., a variable width). Width 710 can be defined parallel to rotation axis 706. Wheel device 704 can comprise a straight edge 712. As a non-limiting example, the geometric relationship between wheel device 704 and straight edge 712 can be described as wheel device 704 having a cross section shaped as a circle minus a missing circular segment. Straight edge 712 can be described as coinciding with a chord of the circle and a boundary of the missing circular segment.

In some embodiments, ring feature 708 can comprise a wedge. The wedge can be curved so as to coincide with a circular curvature of wheel device 704. Variable width 710 can vary according to the shape of the wedge. For example, a width of the wedge (i.e., width of ring feature 708) can vary (increase or decrease) along the wedge from a first width 714 to a second width 716. In other words, width 710 can be variable with respect to an azimuthal direction of the wheel.

In some embodiments, ring feature 708 can be disposed at a periphery of wheel device 704, as shown in FIG. 7. Other arrangements can be envisaged. For example, ring feature 708 can be disposed closer to rotation axis 706 (i.e., not at the periphery of wheel device 704). Ring feature 708 can be a partial annular structure. For example, as shown in FIG. 7 as a non-limiting example, straight edge 712 can interrupt the circular shape of wheel device 704 and/or ring feature 708. Wheel device 704 can have cross sections different from a circle, for example, a spiral with increasing radius, an ellipse, or the like.

In some embodiments, actuator 702 can rotate wheel device 704 about rotation axis 706. Locking device can also comprise a controller 728. Controller 728 can control actuator 702. Actuator 702 can comprise a stopping device (e.g., a breaking mechanism; not shown). Controller 728 can activate the stopping device to lock a rotation of wheel device 704.

Figure 8A:
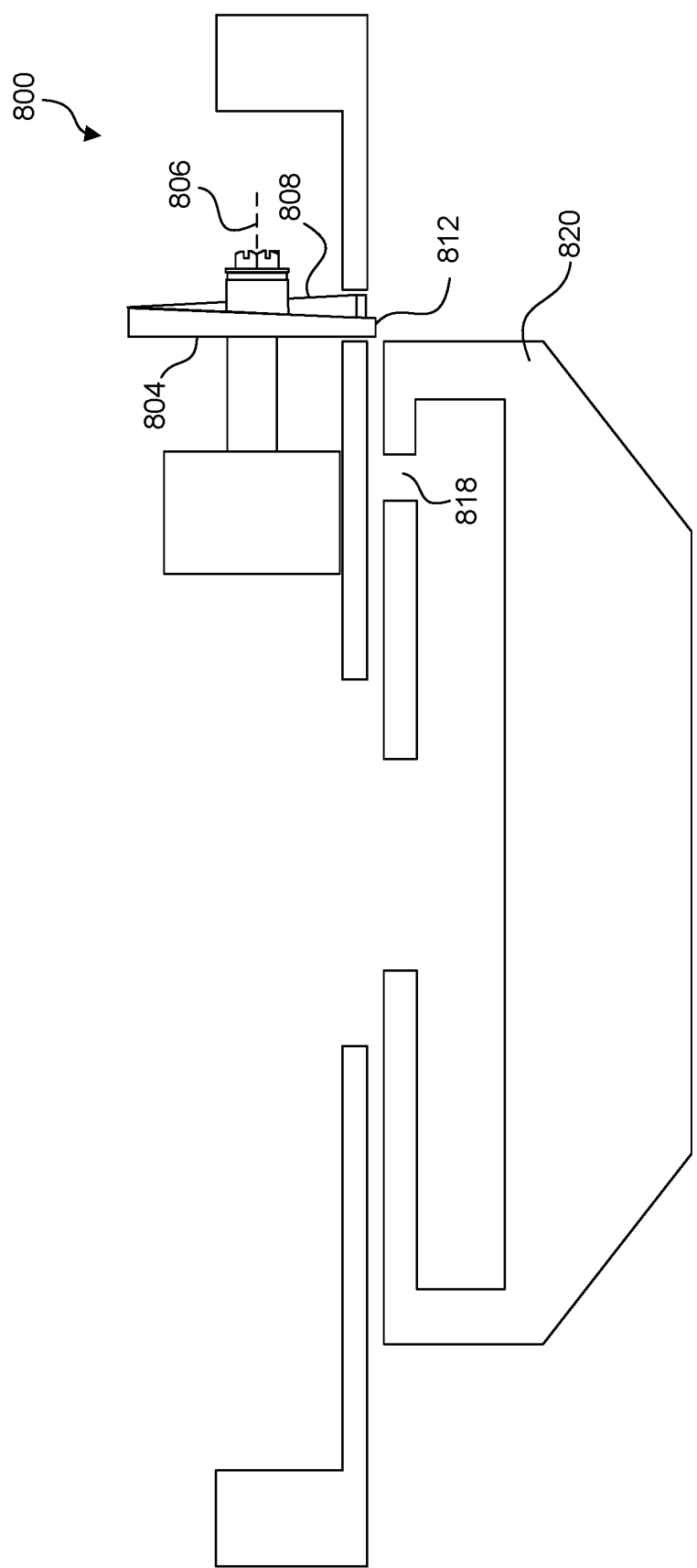
Figure 8B:
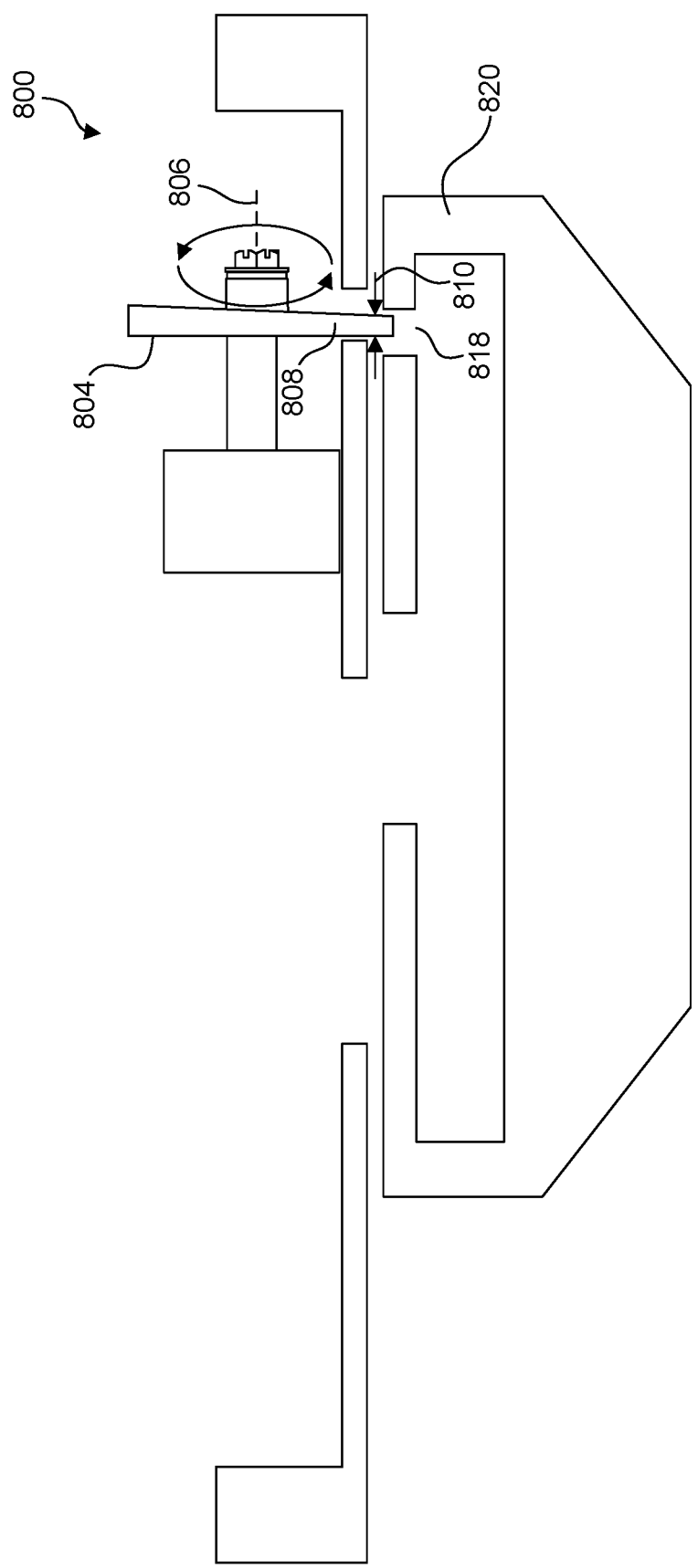

FIGS. 8A and 8B show a locking device 800, according to some embodiments. In some embodiments, locking device 800 can represent another view of locking device 700 (FIG. 7) while highlighting additional details. For example, FIGS. 8A and 8B can illustrate different configurations of locking device 700. Unless otherwise noted, structures and functions described previously for elements of FIG. 7 can also apply to similarly numbered elements of FIGS. 8A and 8B (e.g., reference numbers sharing the two right-most numeric digits). Elements of FIGS. 8A and 8B that are comparable to elements of FIG. 7 will not be reintroduced.

In some embodiments, FIG. 8A shows a state of rotation of a wheel device 804 wherein a ring feature 808 of wheel device 804 is disposed proximal to a slot 818 of an object 820, but not inside slot 818. The state of rotation shown in FIG. 8A is an open lock configuration. The open lock configuration can be achieved, for example, by setting the rotational position of wheel device 804 such that a straight edge 812 of wheel device 804 is proximal to slot 818.

In some embodiments, ring feature 808 can engage slot 818, resulting in the locked configuration of locking device 800 as shown in FIG. 8B. The locked configuration can be achieved, for example, by rotating wheel device 804 such that a width 810 of ring feature 808 fits snuggly in slot 818. Width 810 is a variable width. Locking device 800 can be arranged such that a narrow portion of width 810 first enters slot 818 and then wider portions of width 810 can fill the opening of slot 818 as wheel device 804 is rotated. With the opening of slot 818 filled by width 810, a relative motion between locking device 800 and object 820 is prevented. In other words, the rotating adjusts width 810 within slot 818 such that a relative motion between locking device 800 and object 820 is prevented.

In some embodiments, the variable width 810 of ring feature 808 can resolve the previously mentioned issues of clearances in conventional immobilizer locks. For example, slot 818 can be wider than a narrowest portion of ring feature 808 (see e.g., first width 714 in FIG. 7). The opening of slot 818 can be, for example, twice as wide as the narrowest portion of ring feature 808. In this scenario, ring feature 808 can have enough clearance. The clearance can help locking device 800 to avoid collisions as ring feature 808 is inserted into slot 818. A controller (e.g., controller 728 in FIG. 7) can adjust a clearance between ring feature 808 and the slot boundary by controlling an amount of rotation of wheel device 804.

In some embodiments, when wheel device 804 is rotated far enough so as to be in the configuration shown in FIG. 8B, width 810 of ring feature 808 fills approximately the entire opening of slot 818, thereby eliminating almost all of the clearance at the opening of slot 818. In the event of an exceptional circumstance in which a relative movement between object 820 and locking device 800 can no longer be controlled (e.g., a power loss), any further relative movement is prevented since ring feature 808 has used some or all of the movement budget that would have resulted from a clearance at the opening of slot 818. The term "prevent" can be used herein to refer to a reduction of an amount as compared to an amount resulting from a conventional method. For example, if a conventional locking device has a motion range of 1 mm, and locking device 800 can reduce that motion range to 0.1 mm, it can be said that 0.9 mm of relative motion is prevented when using locking device 800.

In some embodiments, reducing the clearance while leaving some clearance remaining can be desirable. For example, in lithographic apparatuses, it can be detrimental to perform functions that have a risk of generating contaminants. If ring feature 808 were to make contact (consistently or on occasion) with the walls of slot 818, there is an increased risk to generate contaminant particulates from the resulting friction. Calibration can be performed on locking device 800 in order to determine the amount of clearance remaining in slot 818 with respect to a rotational position of wheel device 804. As stated above, the calibration can be performed such that a clearance of 0.1 mm-0.05 mm (for example: 0.1 mm, 0.05 mm, 0.01 mm, or 0.05 mm) is allowed to remain when ring feature 808 engages slot 818.

In some embodiments, object 820 can be a rigid support member of a system in which locking device 800 is to be used. For example, locking device 800 can be implemented in lithographic apparatus LA (FIG. 1), with locking device 800 being disposed on wafer stage WT and object 820 being an immobile part of the frame of lithographic apparatus LA. It should be appreciated that, in some embodiments, locking device 800 can be disposed on an immobile structure and slot 818 can be disposed on a fixed structure. It should also be appreciated that, in some embodiments, locking device 800 can be disposed on a first movable structure and slot 818 can be disposed on a second, independent movable structure.

Figure 9:
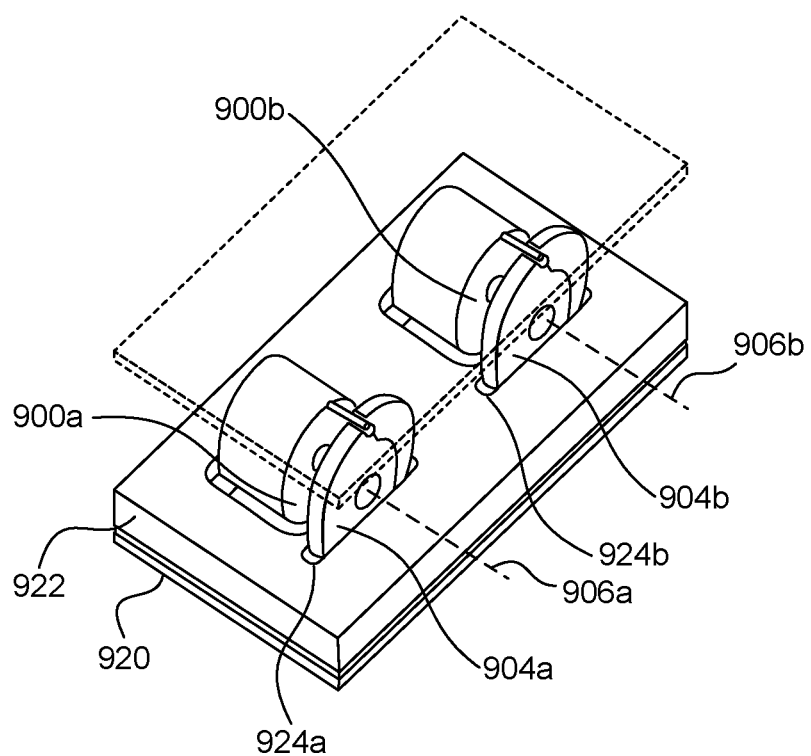

FIG. 9 shows a locking device, according to some embodiments. In some embodiments, the locking device in FIG. 9 can comprise locking devices 900a and 900b. Locking device 900a can represent another view of locking device 700 (FIG. 7) or 800 (FIGS. 8A and 8B). For example, locking devices 900a and 900b of FIG. 9 can be identical or similar to locking devices 700 (FIG. 7) or 800 (FIG. 8). Unless otherwise noted, structures and functions described previously for elements of FIGS. 7, 8A, and 8B can also apply to similarly numbered elements of FIG. 9 (e.g., reference numbers sharing the two right-most numeric digits)—structures and functions of elements of FIG. 9 should be apparent from descriptions of corresponding elements of FIGS. 7, 8A, and 8B.

In some embodiments, locking devices 900a and 900b are disposed on an object 922. Object 922 can comprise through-slots 924a and 924b. Locking devices 900a and 900b can engage corresponding slots disposed on an object 920 (hidden from view due to perspective). In the configuration shown FIG. 9, through-slots 924a and 924b allow corresponding wheel devices 904a and 904b of locking devices 900a and 900b to reach through object 922 and reach the corresponding slots of object 920. Relative motion between objects 920 and 922 can be prevented by rotating wheel devices 904a and 904b to engage the slots of object 920.

In some embodiments, through-slots 924a and 924b can be optional. For example, object 920 can be disposed above locking devices 900a and 900b (see dashed outline). In this configuration, locking devices 900a and 900b are located between objects 920 and 922 and wheel devices 904a and 904b can have direct access to the slots of object 920. In some embodiments, there can be more than two slots on objects 920 and 922—for example, additional slots for corresponding additional locking devices.

In some embodiments, introducing a second locking device does more than merely repeat the device. A technical significance of using a second locking device 900b, as opposed to one locking device 900a alone, is that additional degrees of freedom can be locked. In the most general case, object 920 can have three translation directions (e.g., X, Y, Z) and three rotational directions (e.g., $R_X$, $R_Y$, $R_Z$) with respect to object 922. The configuration shown in FIG. 9 can be used to ensure movement lock in at least one translation axis and one rotation axis, whereas using a single locking device may not be able to do so. Furthermore, for some systems, it may be desirable to prevent motion in a particular direction (e.g., −X, +X, or the like). For example, object 922 can be biased in a particular direction relative to object 920 (e.g., cable attachments providing a slight pulling force on the objects). Locking devices 900a and/or 900b can be structured and configured to favor a particular direction.

In some embodiments, wheel device 904a has a rotation axis 906a and wheel device 904b has a rotation axis 906b. FIG. 9 shows a configuration where rotation axes 906a and 906b are parallel and in the same plane. However, in some embodiments, rotation axes 906a and 906b can be non-parallel. By skewing rotation axes 906a and 906b so as to not be parallel, a third degree of freedom can be locked. For example, at least X, Y, and $R_Z$ can be locked when arranging rotation axes 906a and 906b so as to be at different orientations. For skewed rotation axes 906a and 906b, the axes may be approximately in the same plane (e.g., intersecting) or on different planes (not intersecting). Explained in different terms, the axes may be approximately parallel or not parallel. In the non-parallel scenario, the axes can intersect or not intersect.

FIGS. 10A and 10B show an object 1020 used in connection with a locking device, according to some embodiments. In some embodiments, object 1020 can represent another view of object 820 (FIGS. 8A and 8B) or 920 (FIG. 9). Unless otherwise noted, structures and functions described previously for elements of FIGS. 7, 8A, 8B, and 9 can also apply to similarly numbered elements of FIGS. 10A and 10B (e.g., reference numbers sharing the two right-most numeric digits)—structures and functions of elements of FIGS. 10A and 10B should be apparent from descriptions of corresponding elements of FIGS. 7, 8A, 8B, and 9.

Referring to FIG. 10A, in some embodiments, object 1020 can comprise slots 1018a and 1018b. Slots 1018a and 1018b can have a rectangular cross section. The size of the rectangular cross section can be such that wheel devices 904a and 904b (FIG. 9) can fit into slots 1018a and 1018b. In some embodiments, the perimeter of the rectangular cross sections can be interrupted by protrusions 1026a and 1026b. Though the cross section can be described as being rectangular, the rectangular cross section is not limited to being perfectly rectangular. The rectangular cross section can be approximately rectangular and can have rounded corners, indentations, and/or protrusions. Protrusions 1026a and 1026b can be useful for dealing with positional uncertainties when slots 1018a and 1018b are positioned proximal to locking devices 900a and 900b (FIG. 9). The uncertainties can arise from, for example, uncertainties from motor movement. In another example, uncertainty can arise from manufacturing tolerances. Therefore, ring features of embodiments herein can allow larger manufacturing tolerances, resulting in reduced production time and cost of fabrication.

In some embodiments, ring features 1008a and 1008b can be rotated into slots 1018a and 1018b, respectively. For drawing clarity, locking devices are not shown in FIG. 10, but cross sections of ring features 1008a and 1008b are shown, as well as corresponding rotation axes 1006a and 1006b (see description of corresponding elements of FIGS. 7, 8A, 8B, and 9 for structural and functional details). The rotation of ring features 1008a and 1008b can be stopped such that ring features 1008a and 1008b are almost in contact with protrusions 1026a and 1026b. In some embodiments, some applications can use ring features 1008a and 1008b and protrusions 1026a and 1026b in contact. In some embodiments, some applications can use ring features 1008a and 1008b and protrusions 1026a and 1026b in near-contact. In a near-contact use case, rotation of ring features 1008a and 1008b can be controlled to provide a clearance of 1 µm-100 µm (for example: 1 µm, 10 µm, 50 µm, 100 µm, or the like).

In some embodiments, protrusions 1026a and 1026b can provide a smooth Hertzian contact point. Flat areas of ring features 1008a and 1008b can contact the smooth curved surfaces of protrusions 1026a and 1026b, as opposed to using a the sharp edges of ring features 1008a and 1008b as the contact points. This can prevent wear and contaminant creation.

In some embodiments, the amount of rotation of ring features 1008a and 1008b can determine a clearance amount between ring features 1008a and protrusions 1026a and 1026b. A controller can be used to control the amount of rotation of ring features 1008a and 1008b (e.g., controller 728 in FIG. 7), thereby also controlling the amount of clearance.

In some embodiments, a rotation of ring feature 1008a can be opposite of a rotation of ring feature 1008b, resulting in the mirrored wedge arrangement shown in FIG. 10A. This arrangement can further prevent relative movement in two or more degrees of freedom.

Referring to FIG. 10B, in some embodiments, slots 1018a and 1018b and rotation axes 1006a and 1006b can be oriented skewed (e.g., not parallel). This arrangement can prevent relative movement in three or more degrees of freedom.

FIG. 11 shows method steps for performing functions using locking devices as described herein, according to some embodiments. The method is directed to using a locking device comprising a slotted object and an actuator coupled to a wheel device comprising a ring feature having a width that is variable with respect to an azimuthal direction of the wheel device. At step 1102, the wheel device is rotated about a rotation axis using the actuator. At step 1104, a slot of the slotted object is engaged, via the rotating, using the ring feature. For example, a portion of the ring feature can extend through the slot. The ring feature may or may not contact the slotted object when the ring feature engages the slot. At step 1106, the width within the slot is adjusted, via the rotating, such that a relative motion between the locking device and the slotted object is prevented.

The method steps of FIG. 11 may be performed in any conceivable order and it is not required that all steps be performed. Moreover, the method steps of FIG. 11 described above merely reflect an example of steps and are not limiting. It should be understood that the present disclosure also envisages other method steps based on embodiments described in reference to FIGS. 1-10B (e.g., controlling a clearance between a protrusion of the slot and a ring feature, using more than one locking device, or the like).

The ranges and dimensions disclosed herein are given by way of example, and not limitation.

The embodiments may further be described using the following clauses:

1. A lithographic apparatus comprising:
    an illumination system configured to illuminate a pattern of a patterning device;
    a projection system configured to project an image of the pattern onto a substrate;
    a movable stage configured to support the patterning device or the substrate;
    a slotted object; and
    a locking device configured to prevent a motion of the movable stage, the locking device comprising:
        an actuator; and
        a wheel device comprising a ring feature and coupled to the actuator, wherein
            the actuator is configured to rotate the wheel device about a rotation axis,
            the ring feature has a width defined parallel to the rotation axis,
            the width is variable with respect to an azimuthal direction of the wheel device,
            the ring feature is configured to engage a slot of the slotted object,
            the wheel device or the slotted object is coupled to the movable stage, and
            the rotating adjusts the width of the ring feature within the slot such that a relative motion between the locking device and the slotted object is prevented.
2. The lithographic apparatus of clause 1, wherein the locking device is coupled to the movable stage and the slotted object is coupled to a fixed portion of the lithographic apparatus.
3. The lithographic apparatus of clause 1, wherein the ring feature comprises a wedge and the width varies along the wedge from a first width to a second width different from the first width.
4. The lithographic apparatus of clause 1, further comprising:
    a second actuator; and
    a second wheel device comprising a ring feature and coupled to the second actuator, wherein
        the second actuator is configured to rotate the second wheel device about a second rotation axis,
        the ring feature of the second wheel device has a width defined parallel to the second rotation axis,
        the width of the ring feature of the second wheel device is variable with respect to an azimuthal direction of the second wheel device,
        the ring feature of the second wheel device is configured to engage a second slot of the object, and
        the rotating of the second wheel device adjusts the width of the ring feature of the second wheel device within the second slot such that a relative motion between the locking device and the object is prevented.
5. The lithographic apparatus of clause 4, wherein the rotation axis and the second rotation axis are not parallel.
6. The lithographic apparatus of clause 4, wherein the rotation axis and the second rotation axis are approximately in a same plane.
7. The lithographic apparatus of clause 4, wherein the wheel device and second wheel device are configured to prevent at least two degrees of freedom of relative motion between the locking device and the object.
8. The lithographic apparatus of clause 1, further comprising a controller configured to control the actuator and to adjust a clearance between the ring feature and the slot by controlling an amount of rotation of the wheel device.
9. The lithographic apparatus of clause 1, wherein:
    the slot comprises a cross section having a protrusion; and
    an amount of rotation of the ring feature determines an amount of clearance between the ring feature and the protrusion.
10. A device comprising:
    an actuator; and
    a wheel device comprising a ring feature and coupled to the actuator, wherein
        the actuator is configured to rotate the wheel device about a rotation axis,
        the ring feature has a width defined parallel to the rotation axis,
        the width is variable with respect to an azimuthal direction of the wheel device,
        the ring feature is configured to engage a slot of an object, and
        the rotating adjusts the width of the ring feature within the slot such that a relative motion between the device and the object is prevented.
11. The device of clause 10, wherein the ring feature comprises a wedge and the width varies along the wedge from a first width to a second width.
12. The device of clause 10, further comprising:
    a second actuator; and
    a second wheel device comprising a ring feature and coupled to the second actuator, wherein
        the second actuator is configured to rotate the second wheel device about a second rotation axis,
        the ring feature of the second wheel device has a width defined parallel to the second rotation axis,
        the width of the ring feature of the second wheel device is variable with respect to an azimuthal direction of the second wheel device,
        the ring feature of the second wheel device is configured to engage a second slot of the object, and
        the rotating of the second wheel device adjusts the width of the ring feature of the second wheel device within the second slot such that a relative motion between the device and the object is prevented.
13. The device of clause 12, wherein the rotation axis and the second rotation axis are not parallel.
14. The device of clause 12, wherein the rotation axis and the second rotation axis are approximately in a same plane.

15. The device of clause 12, wherein a rotation direction of the wheel device is opposite of a rotation direction of the second wheel device.
16. The device of clause 12, wherein the wheel device and second wheel device are configured to prevent at least two degrees of freedom of relative motion between the device and the object.
17. The device of clause 10, further comprising a controller configured to control the actuator and to adjust a clearance between the ring feature and the slot by controlling an amount of rotation of the wheel device.
18. The device of clause 17, wherein the actuator further comprises a stopping device and the controller is configured to activate the stopping device to lock the rotation of the wheel device.
19. The device of clause 10, wherein:
   the slot comprises a cross section having a protrusion; and
   an amount of rotation of the ring feature determines an amount of clearance between the ring feature and the protrusion.
20. A method of using a locking device comprising a slotted object and an actuator coupled to a wheel device comprising a ring feature having a width that is variable with respect to an azimuthal direction of the wheel device, the method comprising:
   rotating the wheel device about a rotation axis using the actuator;
   engaging, via the rotating, a slot of the slotted object using the ring feature; and
   adjusting, via the rotating, the width of the ring feature within the slot such that a relative motion between the locking device and the slotted object is prevented.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as specific examples of the more general terms "substrate" or "target portion", respectively. The substrate referred to herein can be processed, before or after exposure, in for example a track unit (a tool that typically applies a layer of resist to a substrate and develops the exposed resist) and/or a metrology unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may be made in this text to embodiments of the present disclosure in the context of a lithographic apparatus, embodiments of the disclosure may be used in other apparatuses. Embodiments of the disclosure may form part of a mask inspection apparatus, a metrology apparatus, or any apparatus that measures or processes an object such as a wafer (or other substrate) or mask (or other patterning device). These apparatuses may be generally referred to as lithographic tools. Such lithographic tools may use vacuum conditions or ambient (non-vacuum) conditions.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

The invention claimed is:
1. A lithographic apparatus comprising:
   an illumination system configured to illuminate a pattern of a patterning device;
   a projection system configured to project an image of the pattern onto a substrate;
   a movable stage configured to support the patterning device or the substrate;
   a slotted object; and
   a locking device configured to prevent a motion of the movable stage, the locking device comprising:
      an actuator; and a wheel device comprising a ring feature and coupled to the actuator, wherein:
the actuator is configured to rotate the wheel device about a rotation axis,
the ring feature has a width defined parallel to the rotation axis,
the width is variable with respect to an azimuthal direction of the wheel device,
the ring feature is configured to engage a slot of the slotted object,
the wheel device or the slotted object is coupled to the movable stage, and
the rotating adjusts the width of the ring feature within the slot such that a relative motion between the locking device and the slotted object is prevented.

2. The lithographic apparatus of claim 1, wherein:
the locking device is coupled to the movable stage and the slotted object is coupled to a fixed portion of the lithographic apparatus; and
the ring feature comprises a wedge and the width varies along the wedge from a first width to a second width different from the first width.

3. The lithographic apparatus of claim 1, further comprising:
a second actuator; and
a second wheel device comprising a ring feature and coupled to the second actuator, wherein:
the second actuator is configured to rotate the second wheel device about a second rotation axis,
the ring feature of the second wheel device has a width defined parallel to the second rotation axis,
the width of the ring feature of the second wheel device is variable with respect to an azimuthal direction of the second wheel device,
the ring feature of the second wheel device is configured to engage a second slot of the slotted object, and
the rotating of the second wheel device adjusts the width of the ring feature of the second wheel device within the second slot such that a relative motion between the locking device and the slotted object is prevented.

4. The lithographic apparatus of claim 3, wherein:
the rotation axis and the second rotation axis are not parallel;
the rotation axis and the second rotation axis are approximately in a same plane; and
the wheel device and second wheel device are configured to prevent at least two degrees of freedom of relative motion between the locking device and the slotted object.

5. The lithographic apparatus of claim 1, further comprising a controller configured to control the actuator and to adjust a clearance between the ring feature and the slot by controlling an amount of rotation of the wheel device.

6. The lithographic apparatus of claim 1, wherein:
the slot comprises a cross section having a protrusion; and
an amount of rotation of the ring feature determines an amount of clearance between the ring feature and the protrusion.

7. A device comprising:
an actuator; and
a wheel device comprising a ring feature and coupled to the actuator, wherein
the actuator is configured to rotate the wheel device about a rotation axis,
the ring feature has a width defined parallel to the rotation axis,
the width is variable with respect to an azimuthal direction of the wheel device,
the ring feature is configured to engage a slot of a slotted object, and
the rotating adjusts the width of the ring feature within the slot such that a relative motion between the device and the slotted object is prevented.

8. The device of claim 7, wherein the ring feature comprises a wedge and the width varies along the wedge from a first width to a second width.

9. The device of claim 7, further comprising:
a second actuator; and
a second wheel device comprising a ring feature and coupled to the second actuator, wherein:
the second actuator is configured to rotate the second wheel device about a second rotation axis,
the ring feature of the second wheel device has a width defined parallel to the second rotation axis,
the width of the ring feature of the second wheel device is variable with respect to an azimuthal direction of the second wheel device,
the ring feature of the second wheel device is configured to engage a second slot of the slotted object, and
the rotating of the second wheel device adjusts the width of the ring feature of the second wheel device within the second slot such that a relative motion between the device and the slotted object is prevented.

10. The device of claim 9, wherein the rotation axis and the second rotation axis are not parallel.

11. The device of claim 9, wherein the rotation axis and the second rotation axis are approximately in a same plane.

12. The device of claim 9, wherein:
a rotation direction of the wheel device is opposite of a rotation direction of the second wheel device; and
the wheel device and second wheel device are configured to prevent at least two degrees of freedom of relative motion between the device and the slotted object.

13. The device of claim 7, further comprising a controller configured to control the actuator and to adjust a clearance between the ring feature and the slot by controlling an amount of rotation of the wheel device, wherein the actuator further comprises a stopping device and the controller is configured to activate the stopping device to lock the rotation of the wheel device.

14. The device of claim 7, wherein:
the slot comprises a cross section having a protrusion; and
an amount of rotation of the ring feature determines an amount of clearance between the ring feature and the protrusion.

15. A method of using a locking device comprising a slotted object and an actuator coupled to a wheel device comprising a ring feature having a width that is variable with respect to an azimuthal direction of the wheel device, the method comprising:
rotating the wheel device about a rotation axis using the actuator;
engaging, via the rotating, a slot of the slotted object using the ring feature; and
adjusting, via the rotating, the width of the ring feature within the slot such that a relative motion between the locking device and the slotted object is prevented.

* * * * *